United States Patent [19]

Baisuck et al.

[11] Patent Number: 5,559,718

[45] Date of Patent: Sep. 24, 1996

[54] SYSTEM AND METHOD FOR MODEL-BASED VERIFICATION OF LOCAL DESIGN RULES

[75] Inventors: Allen Baisuck, San Jose, Calif.; Richard L. Fairbank, Schenectady, N.Y.; Walter K. Gowen, III, Troy, N.Y.; Jon R. Henriksen, Latham, N.Y.; William W. Hoover, III, Ballston Lake, N.Y.; Judith A. Huckabay, Union City; Eric Rogoyski, Los Gatos, both of Calif.; Anton G. Salecker, Clifton Park, N.Y.

[73] Assignee: Cadence Design Systems, Inc., San Jose, Calif.

[21] Appl. No.: 234,410

[22] Filed: Apr. 28, 1994

[51] Int. Cl.⁶ .................................. G06F 17/50
[52] U.S. Cl. .................. 364/491; 364/488; 364/489; 364/490; 364/578; 395/500
[58] Field of Search .................. 364/488, 489, 364/490, 491, 578, 900, 550; 371/20, 23, 24; 395/500, 600

[56] References Cited

U.S. PATENT DOCUMENTS

| | | | |
|---|---|---|---|
| 4,306,286 | 12/1981 | Cocke et al. | 364/200 |
| 4,635,218 | 1/1987 | Widdoes, Jr. | 364/578 |
| 4,703,435 | 10/1987 | Darringer et al. | 364/489 |
| 4,725,975 | 2/1988 | Sasaki | 364/900 |
| 4,758,953 | 7/1988 | Morita et al. | 364/490 |
| 4,829,446 | 3/1989 | Draney | 364/488 |
| 4,891,773 | 1/1990 | Ooe et al. | 364/490 |
| 5,038,294 | 8/1991 | Arakawa et al. | 364/491 |
| 5,050,091 | 9/1991 | Rubin | 364/488 |
| 5,051,938 | 9/1991 | Hyduke | 364/488 |
| 5,067,091 | 11/1991 | Nakazawa | 364/490 |
| 5,086,477 | 2/1992 | Yu et al. | 382/8 |
| 5,126,950 | 6/1992 | Rees et al. | 364/490 |
| 5,198,986 | 3/1993 | Ikeda et al. | 364/489 |

(List continued on next page.)

OTHER PUBLICATIONS

Nils Hedenstierna et al., "A Parallel Hierarchical Design Rule Checker," IEEE, 1992, pp. 142–146.

Hedenstierna et al, "The Halo Algorithm—An Algorithm for Hierarchical Design of Rule Checking of VLSI Circuits", 12 Feb. 1993, IEEE, pp. 265–272.

Primary Examiner—Kevin J. Teska
Assistant Examiner—Thai Phan
Attorney, Agent, or Firm—John T. McNelis, Esq.

[57] ABSTRACT

A system for model-based verification of local design rules comprises a processing unit, a verification database wherein a cell reference graph representing an integrated circuit design as a hierarchical collection of cells is stored, a verification function memory wherein a verification function is stored, a friendly worklayer memory, and an unfriendly worklayer memory. Each cell can include shape models and references to lower-level cells. The processing unit first verifies each cell in the cell reference graph that does not reference any lower-level cells, after which the processing unit verifies each cell for which all lower-level cells referenced have been previously verified. During the verification of a selected cell, the processing unit determines whether models in the selected cell interact with other models in the selected cell or with any lower-level cell. Interacting models are referred to as being "unfriendly," and non-interacting models are referred to as being "friendly." The processing unit references a previously calculated verification result when models are friendly, and applies a verification function to models that are unfriendly.

A method for model-based verification of local design rules comprises the steps of: selecting a cell for verification; selecting a verification function; determining whether models in the cell reference graph are unfriendly with a model in the selected cell; applying the selected verification function to each model involved in an unfriendly interaction; and generating an override in the event that a previously calculated verification result is invalid due to unfriendliness between models.

23 Claims, 9 Drawing Sheets

U.S. PATENT DOCUMENTS

| | | | |
|---|---|---|---|
| 5,202,889 | 4/1993 | Aharon et al. | 371/27 |
| 5,212,650 | 5/1993 | Hooper et al. | 364/488 |
| 5,243,538 | 9/1993 | Okuzawa et al. | 364/488 |
| 5,313,398 | 5/1994 | Rohrer et al. | 364/468 |
| 5,345,401 | 9/1994 | Tani | 364/578 |
| 5,440,720 | 8/1995 | Baisuck et al. | 395/500 |
| 5,481,473 | 1/1996 | Kim et al. | 364/490 |
| 5,497,334 | 3/1996 | Russell et al. | 364/489 |

SYSTEM AND METHOD FOR MODEL-BASED VERIFICATION OF LOCAL DESIGN RULES

CROSS-REFERENCE TO RELATED APPLICATIONS

The subject matter of this application is related to and incorporates by reference the subject matter of the following commonly-assigned, co-pending applications: 1) Ser. No. 08/064,854, entitled "Verification Data Base Structure for Reducing Disk I/O in Integrated Circuit Design Analyzers," filed May 20, 1993, by Allen Baisuck, Richard L. Fairbank, Walter K. Gowen, III, Jon R. Henriksen, William W. Hoover, Judith A. Huckabay, Eric Rogoyski, and Anton G. Salecker; and 2) Ser. No. 08/124,330, entitled "Data Reduction in a System for Analyzing Geometric Databases," filed Sept. 20, 1993, by Allen Baisuck, Richard L. Fairbank, Walter K. Gowen, III, Jon R. Henriksen, William W. Hoover, III, Judith A. Huckabay, Eric Rogoyski, and Anton G. Salecker.

BACKGROUND OF THE INVENTION

1. Field of the Invention

The present invention relates generally to computer systems and methods used in the design of electronic components, and more particularly to a system and method for the verification of an electronic component's design. Still more particularly, the present invention is a system and method for verification of local design rules applied to an integrated circuit layout.

2. Description of the Background Art

Computer systems and methods are used extensively in the design of integrated circuits. A key step in the integrated circuit design process is the verification of each element within a given integrated circuit's design or layout against one or more design rules. A design rule specifies a constraint that must be satisfied to ensure successful fabrication of the integrated circuit under consideration. Local design rules are those design rules that can be verified by analyzing design geometries located within a relatively small distance from each other. For example, a local design rule may require that the minimum spacing between adjacent metal edges be greater than a predetermined minimum distance, or an electrical "short" may occur.

As integrated circuit design complexity has increased, design rule verification has become more difficult and time-consuming. Currently, integrated circuit designs can contain millions of elements. In the prior art, most systems and methods for local design rule verification perform a set of design rule calculations for every element within the integrated circuit design. Verification of local design rules in such cases commonly requires millions of computations and several hours of computation time for even moderately complex integrated circuit designs. This in turn adversely affects the cost of integrated circuit design, making this prior art approach undesirable. Future integrated circuit manufacturing technologies will allow integrated circuit designs having ever-greater complexity, thereby exacerbating the problem.

An alternate approach to local design rule verification recognizes that in virtually all integrated circuit designs, any given element is typically repeated many times. Thus, the number of unique elements in an integrated circuit design is generally much smaller than the total number of elements in the design. The alternate approach attempts to perform the calculations necessary for local design rule verification only on the subset of unique elements, thereby greatly reducing the number of calculations required for the verification of an entire design.

The response of circuit designers to demands for increasing complexity has been an increasing use of circuit element duplication. For example, instead of laying out three separate transistors, it is more efficient to lay out a single-transistor "cell" and to reference the single-transistor cell three times via a higher-level cell. If the three transistors referenced in the higher level cell form a logic gate that is required ten times in the final circuit, an even higher-level cell could reference the three-transistor cell ten times. The original single-transistor cell would then occupy a third level in a design hierarchy. At this point, thirty transistors would appear in the fabricated integrated circuit, yet only one, namely, the single-transistor cell, was laid out.

Notwithstanding the multi-level nature of designs created in the above manner, the final integrated circuit as fabricated will be "flat," that is, all of its components will be placed in a plane when fabricated. While all of the interrelationships among design elements are defined in the hierarchical design, the interrelationships may not be apparent until they are considered in their two-dimensional form. For example, a single element placed in the "topmost" cell of the design hierarchy may have an obscure geometric relationship with many different elements of many lower-level cells. If even one of these relationships is missed during verification, the fabricated integrated circuit may not operate properly. Yet "flattening" each of the relationships according to their two-dimensional form severely multiplies the amount of work to be done and may make the amount of work too large to be handled by conventional computer systems.

The hierarchical nature of integrated circuit designs greatly adds to the complexity of local design rule verification via the alternate approach mentioned above. As a result, prior art systems and methods that have taken the alternate approach to local design rule verification have been unable to generate correct verification results in certain verification situations. More generally, prior art systems and methods have been unable to guarantee accurate local design rule verification results unless design constraints are imposed upon allowable hierarchical relationships between elements in an integrated circuit design. Typical examples of design constraints are as follows: 1) intrusion of a given cell's geometry into an area occupied by a related lower level cell, or "progeny" cell, may not occur more than two levels down in the design hierarchy; 2) two cells referenced by the same higher-level cell, or "sibling" cells, may not overlap; and 3) when polygons used to represent cells overlap, the use of polygons containing acute-angled vertices must be avoided to ensure correct verification results.

What is needed is a system and method for verification of local design rules that minimizes the number of computations required during verification while successfully analyzing integrated circuit designs regardless of the hierarchical relationships between their constituent elements.

SUMMARY OF THE INVENTION

The present invention is a system and method for model-based verification of local design rules. Co-pending application Ser. No. 08/064,854 describes a Verification Data Base (VDB) structure for reducing disk I/O in integrated circuit analyzers. The VDB contains a compressed representation of an integrated circuit layout. In the compressed representation, the integrated circuit layout comprises a set of hierarchically related cells arranged to form a cell reference graph. Within a given cell, shape models or collections of shape models referred to as group models represent portions of electronic devices within the integrated circuit layout. A group model can also contain other group models, and a cell itself is a group model. In co-pending application Ser. No. 08/123,330, an architecture and a method for data reduction applied to an integrated circuit layout represented according to its cell reference graph is described. The data reduction architecture and method serve to reduce the amount of memory required to store results obtained during the integrated circuit layout's verification. The present invention preferably operates in conjunction with the inventions described in the aforementioned applications to provide a system and method for verifying local design rules in an integrated circuit layout on a cell-by-cell basis.

In the present invention, an integrated circuit design or layout is represented as a set of hierarchically arranged cells in a cell reference graph. The collection of shape models and group models corresponding to a given cell are referred to herein as the cell's constituent models. Verification of local design rules for an integrated circuit layout proceeds on a cell-by-cell basis, corresponding to a group model-by-group model basis, from the lowest level to the highest level of the design hierarchy, within each cell of the cell reference graph. Each local design rule is associated with a corresponding verification function. While a complex integrated circuit layout can contain millions of models, the number of unique models present in the layout is generally quite small in comparison. In addition, for a given model, the number of distinct model placement schemes used throughout the integrated circuit layout is also typically very small. For a given model, the present invention advantageously performs a set of verification calculations only for one occurrence of the model in each distinct placement scheme.

For multiple occurrences of a group model, the present invention refers to the group model's previously calculated verification result. Referring to a previously calculated result is much faster than performing the calculations required to obtain the result. Because the present invention eliminates redundant calculations, the time required to verify the integrated circuit design according to local design rules is greatly reduced.

In the present invention, models are referred to as being "friendly" if their placements are such that they do not impinge upon or interact with each other. A friendly model does not affect the verification of another model. If the presence of one model affects the verification of another, both models are referred to herein as being "unfriendly" towards each other. When a model selected for verification is unfriendly towards or interacts with another model, the present invention combines each model participating in the unfriendliness into a participant group model. The participant group model is then verified. Unfriendliness occurring between models in different cells is referred to as a rain relationship. The previous verification result for one or more lower-level or same-level models within the currently selected cell may be invalid in the presence of a rain relationship.

The system of the present invention comprises a processing unit, a program memory, an internal memory, a Circuit Data Base (CDB), a Verification Data Base (VDB), and a verification memory. Each element of the system of the present invention has an input and an output coupled to a common system bus. In the preferred embodiment, the VDB and the verification memory are stored in the internal memory. The processing unit preferably controls the verification of an integrated circuit design under the direction of a sequence of computer program steps stored in the program memory.

The CDB contains the integrated circuit design represented by its constituent cells, where each cell includes references to one or more shape or group models. The VDB contains one instance of each unique shape model and group model used in the CDB, and includes the hierarchical cell reference graph. The verification memory comprises a verification function memory, a friendly function memory, a friendly worklayer memory, an unfriendly worklayer memory, and a completion list memory. Each element of the verification memory has an input and an output coupled to the common system bus. The verification function memory stores each verification function, and the friendly function memory stores a set of "friendly functions." Each friendly function corresponds to a verification function, and is used to determine whether a set of models is friendly in view of its corresponding verification function. The friendly worklayer memory stores shape models that are friendly, and the unfriendly worklayer memory stores shape models that are mutually unfriendly, namely, those shape models comprising a participant group model. The completion list memory stores a completion list that indicates those cells that have been verified.

The processing unit begins model-based local design rule verification by selecting a cell within the cell reference graph that does not itself contain a reference to a lower-level cell. The processing unit also selects a verification function corresponding to a local design rule. The processing unit determines which shape models referenced by the selected cell are mutually friendly, and which shape models are mutually unfriendly. The processing unit stores the mutually friendly shape models in the friendly worklayer memory, and stores the mutually unfriendly shape models in the unfriendly worklayer memory.

For any group model referenced by the selected cell, the processing unit determines whether the group model is unfriendly towards a sibling cell or towards the selected cell. If the group model is unfriendly towards a sibling cell or towards the selected cell, the processing unit identifies each shape model at each hierarchical level below that of the selected cell that is involved in the unfriendliness, and adds each such shape model to the unfriendly worklayer memory. Friendly shape models within lower-level group models that are unfriendly with the selected cell are added to the friendly worklayer memory. The processing unit applies the selected verification function to the unfriendly worklayer memory, and may also apply the selected verification function to the friendly worklayer memory, to generate a verification result.

Verification is first performed upon each cell that does not contain a reference to any lower level cell. After each such cell has been verified, verification is performed upon each cell whose lower-level group models have all been verified. Because verification proceeds in a bottom-up manner while taking intra-cell unfriendliness and inter-cell unfriendliness or rain relationships into account, the present invention successfully performs local design rule verification of an integrated circuit layout regardless of the hierarchical relationships that may be present. During the verification of a given cell that references a lower-level cell, previously calculated results are referenced when the given cell and the lower-level cell are friendly. The present invention therefore greatly reduces the number of calculations that are performed during local design rule verification.

DETAILED DESCRIPTION OF THE PREFERRED EMBODIMENTS

Figure 1:
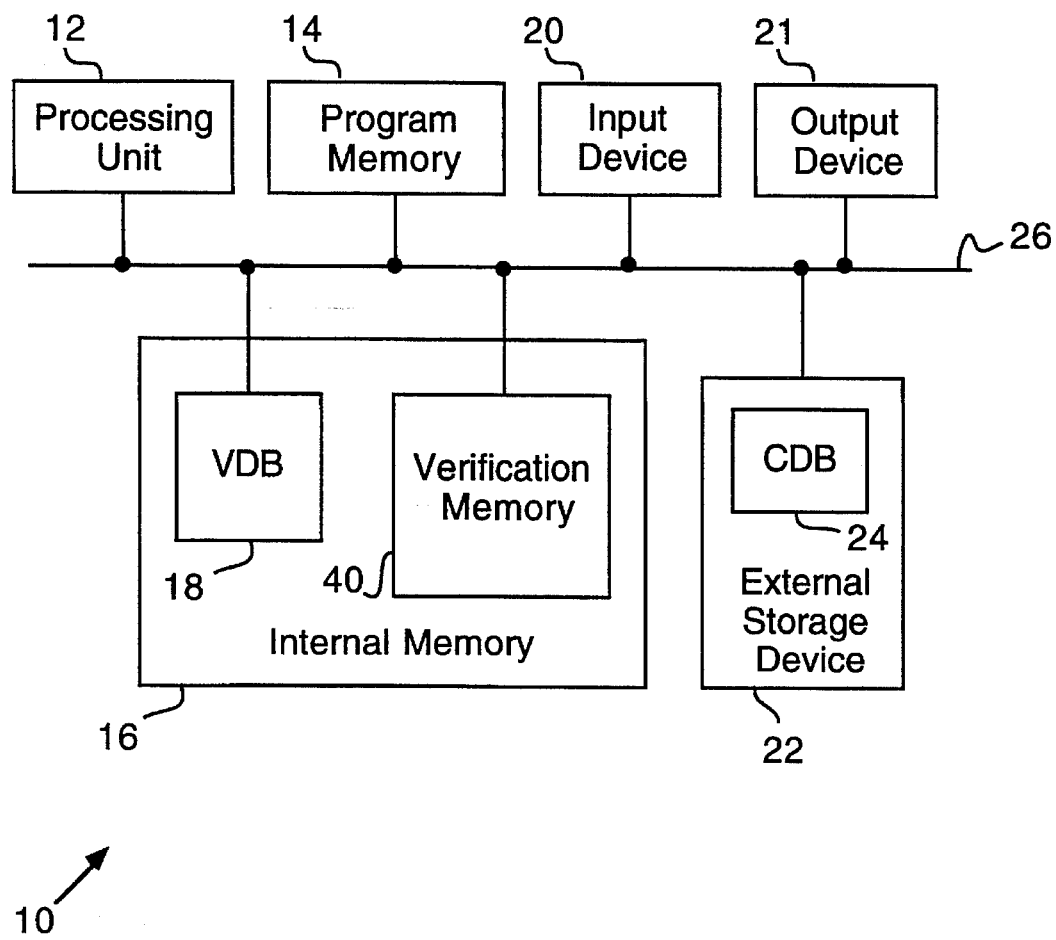
FIG. 1 is a block diagram of a preferred embodiment of a system for model-based local design rule verification constructed in accordance with the present invention.

Referring now to FIG. 1, a block diagram of a preferred embodiment of a system 10 for model-based local design rule verification constructed in accordance with the present invention is shown. The system 10 preferably comprises a processing unit 12; a program memory 14; an internal memory 16 wherein a verification data base (VDB) 18 and a verification memory 40 reside; an input device 20 such as a keyboard or mouse; an output device 21; and an external storage device 22 wherein a circuit data base (CDB) 24 resides. Each element of the system 10 has an input and an output coupled to a common system bus 26. In the preferred embodiment, the internal memory 16 is implemented with random access memory (RAM) and the external storage device 22 is a hard disk drive. In an exemplary embodiment, the system 10 of the present invention comprises a SUN workstation (SUN Microsystems, Inc., Palo Alto, Calif.), a keyboard, a color graphics monitor, RAM wherein the program memory 14 and the internal memory 16 reside, and a hard disk drive wherein the CDB 24 resides.

In the fabrication of an integrated circuit, a set of lithographic masking layers are used to produce electronic devices upon or within a substrate material. Each lithographic masking layer consists of various shapes that are used to create physical portions or regions of one or more electronic devices within the integrated circuit. In the integrated circuit's design or layout, shape models and group models correspond to shapes and groups of shapes, respectively, present in one or more lithographic masking layers. Group models are also referred to as cells. The integrated circuit layout is therefore a collection of constituent cells, where each cell represents a portion of the entire design. In the present invention, each cell contains a reference to one or more constituent models, and comprises: 1) at least one shape model, or 2) one or more other group models, or 3) at least one shape model and one other group model.

Numerically, the integrated circuit layout is represented by coordinate representations of each shape used in the layout. Within the system 10 of the present invention, the numerical coordinate representations of each shape model and group model forming the integrated circuit layout are initially stored in the CDB 24. Because an integrated circuit layout can contain millions of shapes, the CDB 24 is preferably stored in the external storage device 22.

A given cell may appear multiple times in an integrated circuit layout. Because each cell is referenced by one or more other cells within the layout, each cell maintains a hierarchical relationship with each other cell. One hierarchical representation of the integrated circuit layout's constituent cells is referred to as a cell reference graph. The hierarchical relationship that exists between a given cell and a set of related lower-level cells is defined by where the given cell appears in the cell reference graph, and how the given cell is attached to other cells in the cell reference graph. As described in co-pending application Ser. No. 08/064,854 and co-pending application Ser. No. 08/123,330, the integrated circuit layout stored in the CDB 24 is analyzed according to its constituent cells (group models) to generate its corresponding cell reference graph. The cell reference graph and data related to the aforementioned analysis are stored in the VDB 18. Results obtained during the verification of the integrated circuit design are also stored in the VDB 18.

Figure 2:
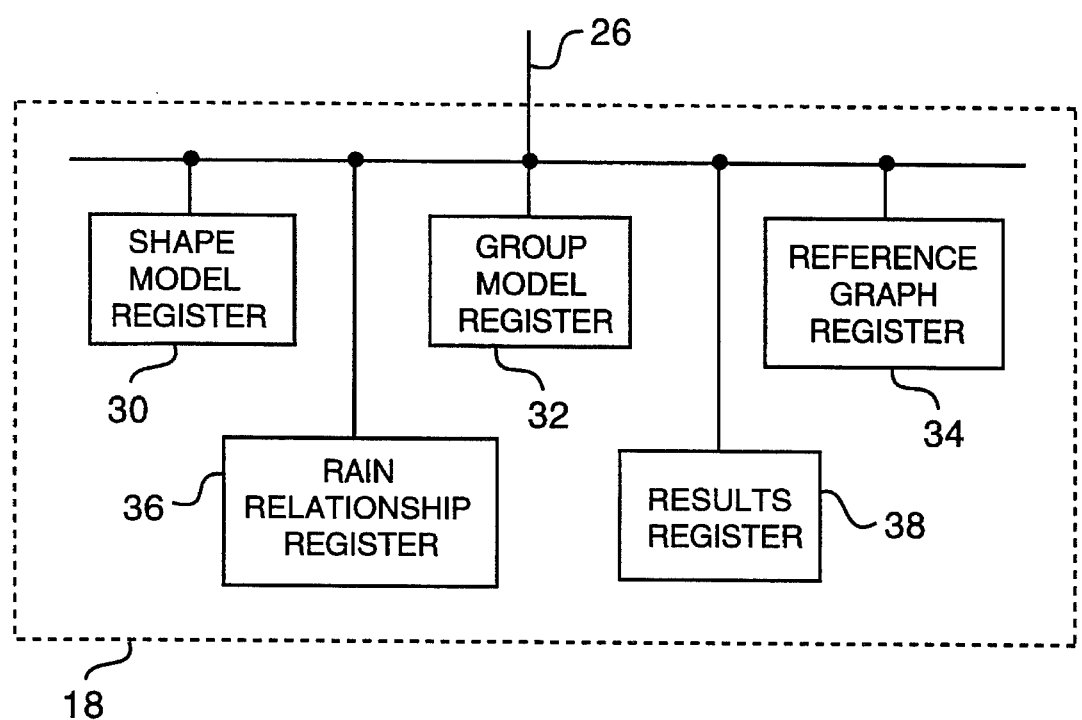
FIG. 2 is a block diagram of a preferred embodiment of a Verification Data Base (VDB) within the system of the present invention.

Referring also now to FIG. 2, a block diagram of a preferred embodiment of the VDB 18 is shown. The VDB 18 is discussed in detail in co-pending patent application Ser. No. 08/124,330. The VDB 18 comprises a shape model register 30, a group model register 32, a reference graph register 34, a rain relationship register 36, and a results register 38. Each element of the VDB 18 is coupled to the common system bus 26, and in the preferred embodiment each element consists of an allocated section of internal memory 16. The shape model register 30 contains one instance of each distinct type of shape model that is either used in the integrated circuit design or calculated to represent an intermediate result during the verification process. The shape model register 30 is initially a library of each unique shape model encountered in the CDB 24. Shape models are preferably stored in the VDB 18 according to their frequency of instantiation within the CDB 24.

In a like manner, the group model register 32 is a library of each unique group model or cell encountered within the integrated circuit design in the CDB 24. For each model used within a cell, whether shape model or group model, the cell contains a model identifier, a stamping point to identify the model's absolute location within the cell, and an orientation to indicate the model's physical rotation within the cell.

The reference graph register 34 contains the cell reference graph indicating the hierarchical relationships between the cells comprising the integrated circuit design. For a particular cell at a given hierarchical level, a lower-level cell that is directly referenced by the particular cell is referred to herein as a "child cell." The particular cell itself is then referred to as the child cell's "parent cell." If the particular cell is at the highest hierarchical level in the cell reference graph, it is referred to as the "root cell," and is defined to occupy level zero in the cell reference graph. Each cell below the root cell is defined to occupy a level greater than zero. The set of cells that are related to the particular cell via a chain of references to lower-level cells are referred to as the particular cell's "descendent cells." Each additional cell occupying the same hierarchical level as the particular cell is referred to as a "sibling cell." If the particular cell does not reference a group model (i.e., another cell) and thus only references one or more shape models, the particular cell is referred to as a "leaf cell." In the preferred embodiment of the system 10, the processing unit 12 performs a verification analysis of the design elements within an integrated circuit layout under the direction of a sequence of computer program steps stored in the program memory 14. During the verification analysis, the processing unit 12 analyzes the cell reference graph, and performs local design rule verifications upon the constituent shape models and group models within each cell requiring verification. In the preferred embodiment, cells are analyzed and verified in hierarchical order beginning with the lowest-level cell. When multiple cells are present at the same hierarchical level, verification proceeds sequentially for each unique cell at this level before higher-level verifications begin.

In the present invention, a model selected for verification is referred to as being "friendly" if its placement is such that it does not interact with or impinge upon another model. If a model is friendly, it can be verified independently of other models. When models interact with or impinge upon each other, they are referred to herein as being "unfriendly" towards each other. In general, a model's friendliness or unfriendliness varies according to the specific local design rule under consideration. When a model selected for verification is unfriendly towards one or more other models, each model involved in the unfriendliness is combined into a participant group model. A collective verification then proceeds for the participant group model. Unfriendliness between models in different cells is referred to herein as a "rain relationship."

The rain relationship register 36 contains a reference to each rain relationship present within the integrated circuit layout's cell reference graph. The presence of a rain relationship between the selected model and another model can invalidate the other model's previously obtained verification result. For example, a local design rule specifying a minimum spacing requirement between shapes may be obviated when the placement of a shape model within a higher-level cell overlaps two closely-spaced shape models in a lower-level cell. If the minimum spacing requirement were violated during the verification of the lower-level cell's shape models, the verification result obtained for the lower-level cell is not valid in the context of the higher-level cell because the higher-level shape model removes the space between the lower-level shapes. When a lower-level or same-level cell's verification result is invalid in the context of a cell selected for verification, a flag or indicator referred to as an override is created. The override indicates a shape model at a lower-level in the selected cell for which a previously-obtained verification result is invalid in the context of the selected cell. The override is stored in the results register 38.

The results register 38 contains the verification results for each cell in the cell reference graph. During the verification of a selected cell, an initial analysis does not consider the selected model's interactions with other shapes or cells referenced by the same parent cell. This is referred to herein as in-group verification. In-group verification produces corresponding in-group results. When the selected cell's parent cell is verified, the selected cell is verified with respect to any rain relationships that may be present. The verification results for models involved in one or more rain relationships are referred to as override results. A given cell in the cell reference graph may require verification with respect to several local design rules. Thus, for each cell considered during verification, the results register 38 contains an in-group results list and an override results list for each local design rule considered. A particular group model's verification result can be either 1) a reference to the verification results obtained for lower-level group models which were mutually friendly; or 2) one or more shape model and group model references representing the verification result obtained from both friendly and unfriendly group models.

Figure 3:
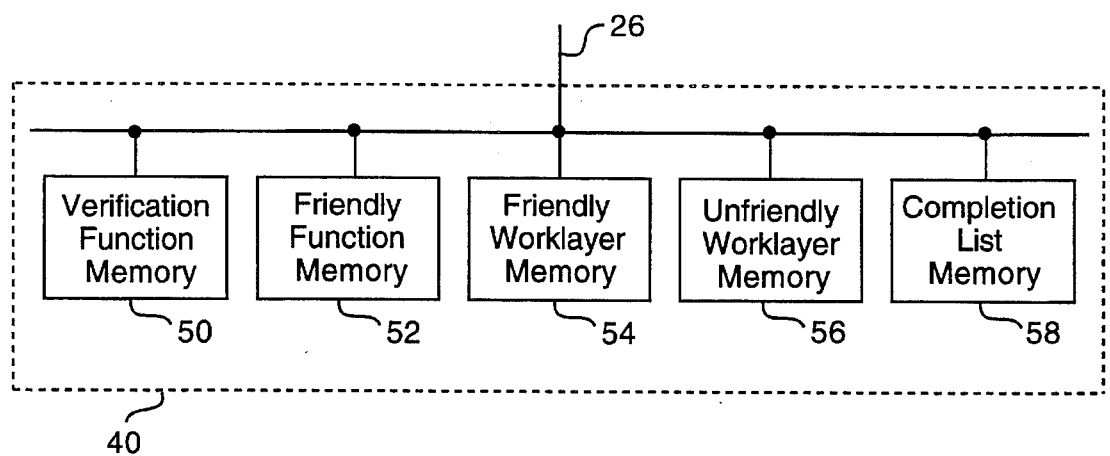
FIG. 3 is a block diagram of a preferred embodiment of a verification memory within the system of the present invention.

During verification, the processing unit 12 maintains data needed during the verification process in the verification memory 40. Referring also now to FIG. 3, a block diagram of a preferred embodiment of the verification memory 40 is shown. The verification memory 40 comprises a verification function memory 50, a friendly function memory 52, a friendly worklayer memory 54, an unfriendly worklayer memory 56, and a completion list memory 58. Each of the elements of the verification memory 40 are coupled to the common system bus 26.

In the present invention, each local design rule that is to be considered during verification corresponds to a verification function. The processing unit 12 stores each verification function required during verification in the verification function memory 50. To determine whether a given set of models are friendly or unfriendly, the processing unit 12 applies a "friendly function" to the set of models. Each friendly function corresponds to a particular verification function. In a manner analogous to the verification function memory 50, the processing unit 12 stores each friendly function required during verification in the friendly function memory 52.

A memory that contains a set of shape models to which the processing unit 12 may apply a verification function is referred to herein as a worklayer. In the present invention, the friendly worklayer memory 54 stores one or more shape models that the processing unit 12 has determined to be friendly. In a like manner, the unfriendly worklayer memory 56 stores one or more shape models that the processing unit 12 has determined to be unfriendly, namely, each shape model in a participant group model generated during verification.

The completion list memory 58 indicates those cells in the cell reference graph that have been verified. When the verification of a given cell is complete, the processing unit 12 stores a reference to the given cell in the completion list memory 58. In the preferred embodiment, the ordering of the cell references stored in the completion list indicates the order in which each corresponding cell had been verified.

Complex integrated circuit layouts can contain millions of models. The number of unique models present in an integrated circuit layout is generally much smaller than the total number of models present. Moreover, each unique model used in the layout typically appears in a relatively small number of distinct placement schemes. Thus, each placement of a given model in the integrated circuit layout is likely to correspond to many other placements.

The application of a verification function to a selected group model results in a set of calculations being performed upon the selected group model and possibly upon one or more other models. The set of calculations produces the selected group model's verification result for the local design rule associated with the verification function. In the prior art, most systems perform a set of verification calculations for each occurrence of each group model in an integrated circuit layout. When the integrated circuit layout contains millions of elements, this prior art approach requires millions of computational operations and an unacceptable amount of time to complete. The system 10 of the present invention advantageously performs a set of verification calculations upon a selected group model either without reference to any placement scheme or with reference to a small number of placement schemes in the cell reference graph. Each placement of a group model in the integrated circuit design is defined by the group model's friendliness or unfriendliness towards other models within the same cell, or by the group model's involvement in any rain relationships. For a given model, multiple occurrences of the model in an identical placement scheme simply produce a reference to, or a copy of, the model's previously calculated verification result. Generation of a reference to a result is a much faster operation than performing the calculations necessary to obtain the result. The present invention therefore eliminates redundant calculations and greatly reduces the time required to perform the integrated circuit layout's local design rule verification.

Figure 4:
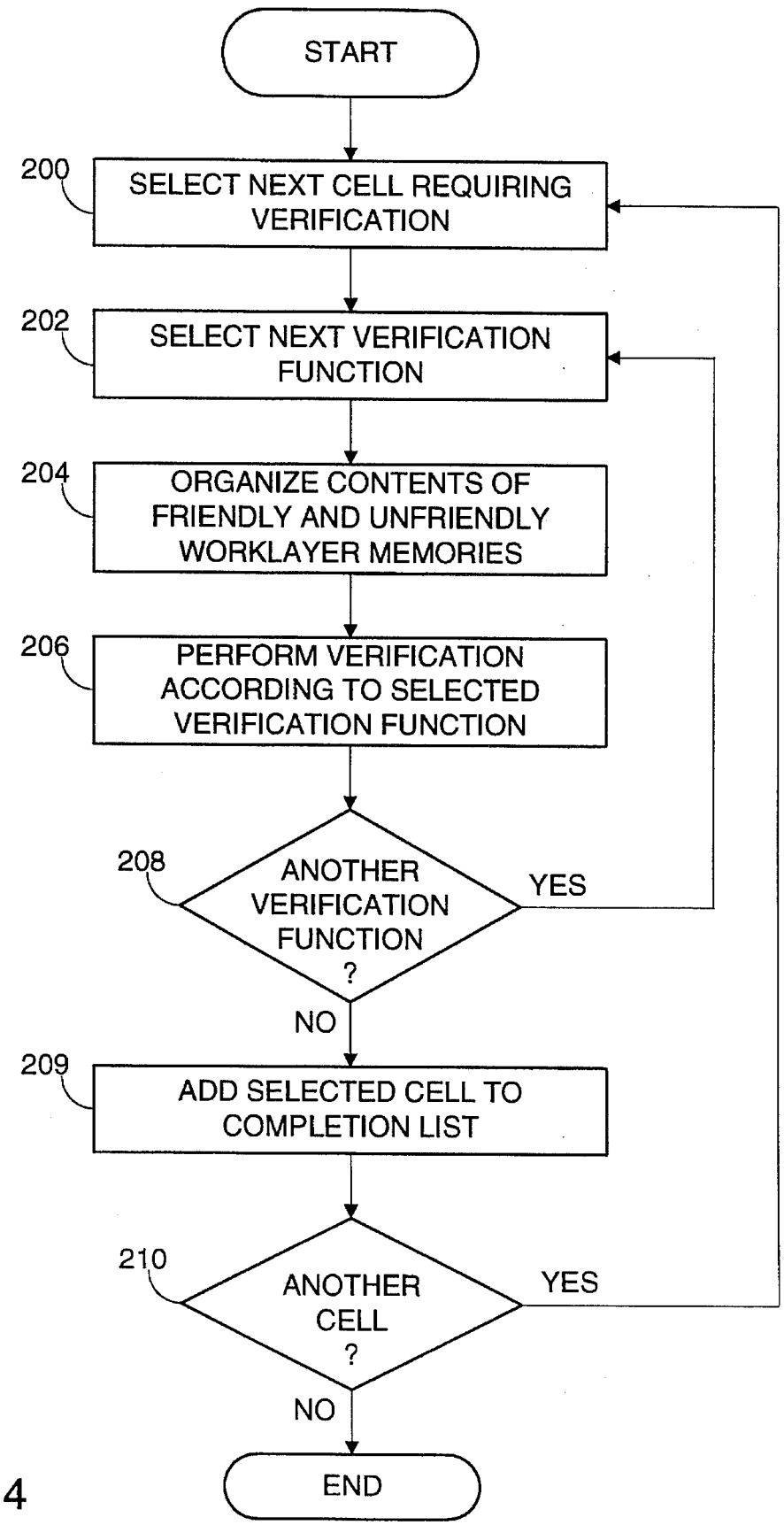
FIG. 4 is a flowchart of a preferred method for model-based local design rule verification in accordance with the present invention.

Referring now to FIG. 4, a flowchart of a preferred method for model-based local design rule verification of an integrated circuit design is shown. In the preferred method, the processing unit 12 performs the integrated circuit design's verification under the direction of a computer program step sequence stored in the program memory 14. The preferred method begins in step 200, with the processing unit 12 selecting a next cell that has not been previously verified. In the selection of the next cell, the processing unit 12 analyzes the cell reference graph and the completion list, and either 1) selects a leaf cell in the event that a leaf cell remains to be verified; or 2) selects a cell whose lower-level constituent group models have each been previously verified. Thus, the processing unit 12 initially selects a leaf cell for verification. After step 200, the processing unit 12 selects a next verification function to be considered from the verification function memory 50 in step 202. Next, in step 204, the processing unit organizes the contents of the friendly and unfriendly worklayer memories 54, 56. During step 204, the processing unit 12 selectively places shape models into the friendly worklayer memory 54 or the unfriendly worklayer memory 56. The specific operations performed during step 204 will be detailed below in the description of FIG. 5. Following step 204, the processing unit 12 applies the selected verification function to the participant group model stored in the unfriendly worklayer memory 56, and selectively applies the selected verification function to the set of shape models stored in the friendly worklayer memory 54 in step 206. Depending upon the particular verification function under consideration, the shape models stored in the friendly worklayer memory 54 may simply be ignored. For example, if the verification function corresponds to the binary AND operation, shape models that do not overlap (i.e., shape models that are friendly) do not contribute to the final verification result and can therefore be ignored. The application of the selected verification function to either the unfriendly worklayer memory 56 or to the friendly worklayer memory 54 results in a set of calculations being performed that generate one or more verification results corresponding to the contents of the unfriendly worklayer memory 56 or the friendly worklayer memory 54, respectively.

In the application of the verification function to the participant group model stored in the unfriendly worklayer memory 56, the processing unit 12 also generates any required overrides. The processing unit 12 stores each verification result and each override in the selected cell's results list within the results register 38. Upon completion of step 206, the processing unit 12 determines whether another verification function is to be considered in step 208. If another verification function is to be considered, the preferred method returns to step 202. If in step 208 the processing unit 12 determines that another verification function is not to be considered, the processing unit 12 adds a reference to the selected cell to the completion list in step 209. Next, the processing unit 12 determines whether another cell is to be verified in step 210. In step 210, the processing unit 12 preferably determines that another cell is to be verified by checking the hierarchical level of the last cell referenced in the completion list. If the hierarchical level of the last cell referenced in the completion list is zero, the most-recently verified cell is the root cell, and the preferred method ends. If the hierarchical level of the last cell referenced in the completion list is not zero, another cell is to be verified, and the preferred method returns to step 200.

Figure 5A:
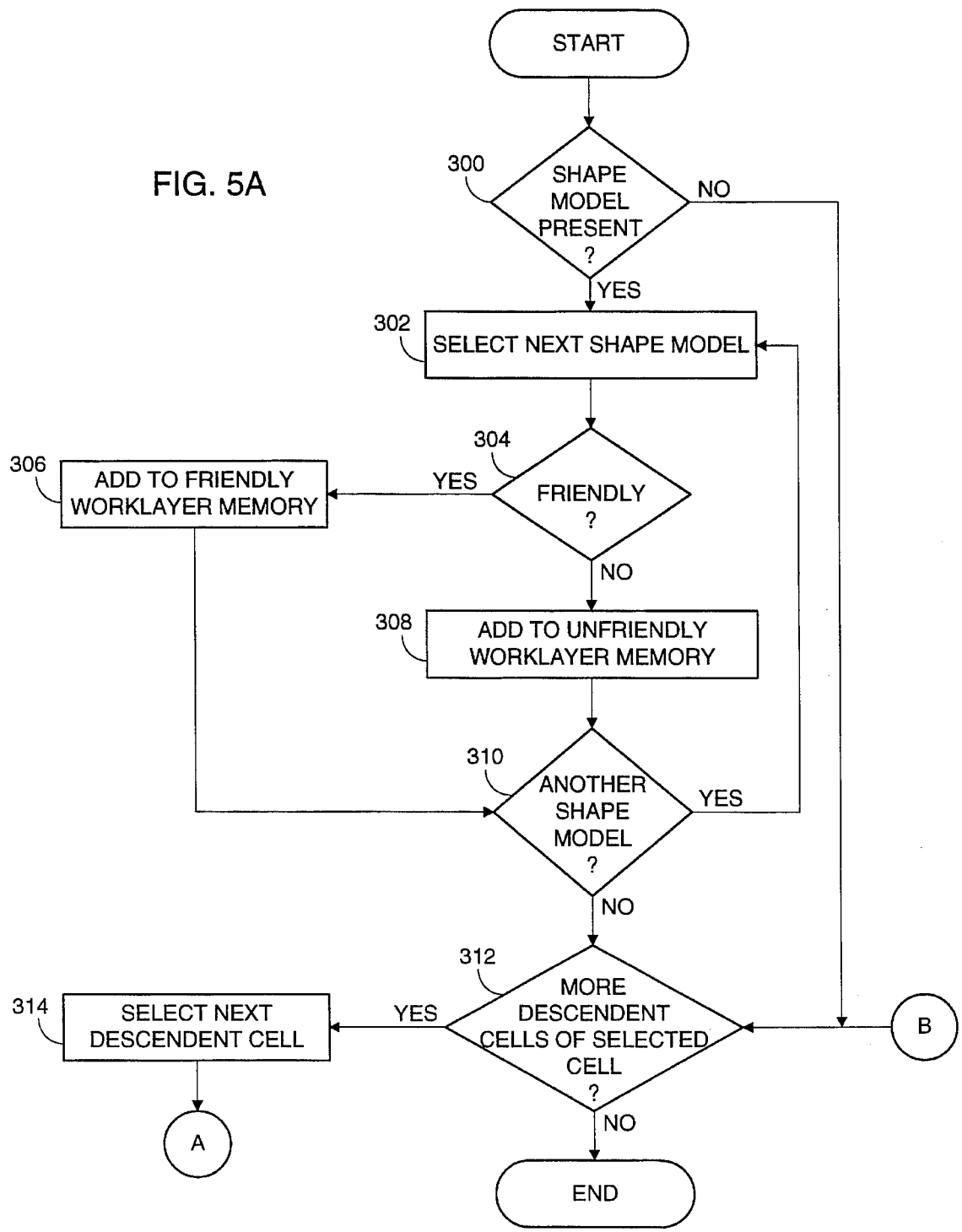
FIGS. 5A and 5B are a flowchart of a preferred method for organizing the contents of a friendly worklayer memory and an unfriendly worklayer memory in the present invention.
Figure 5B:
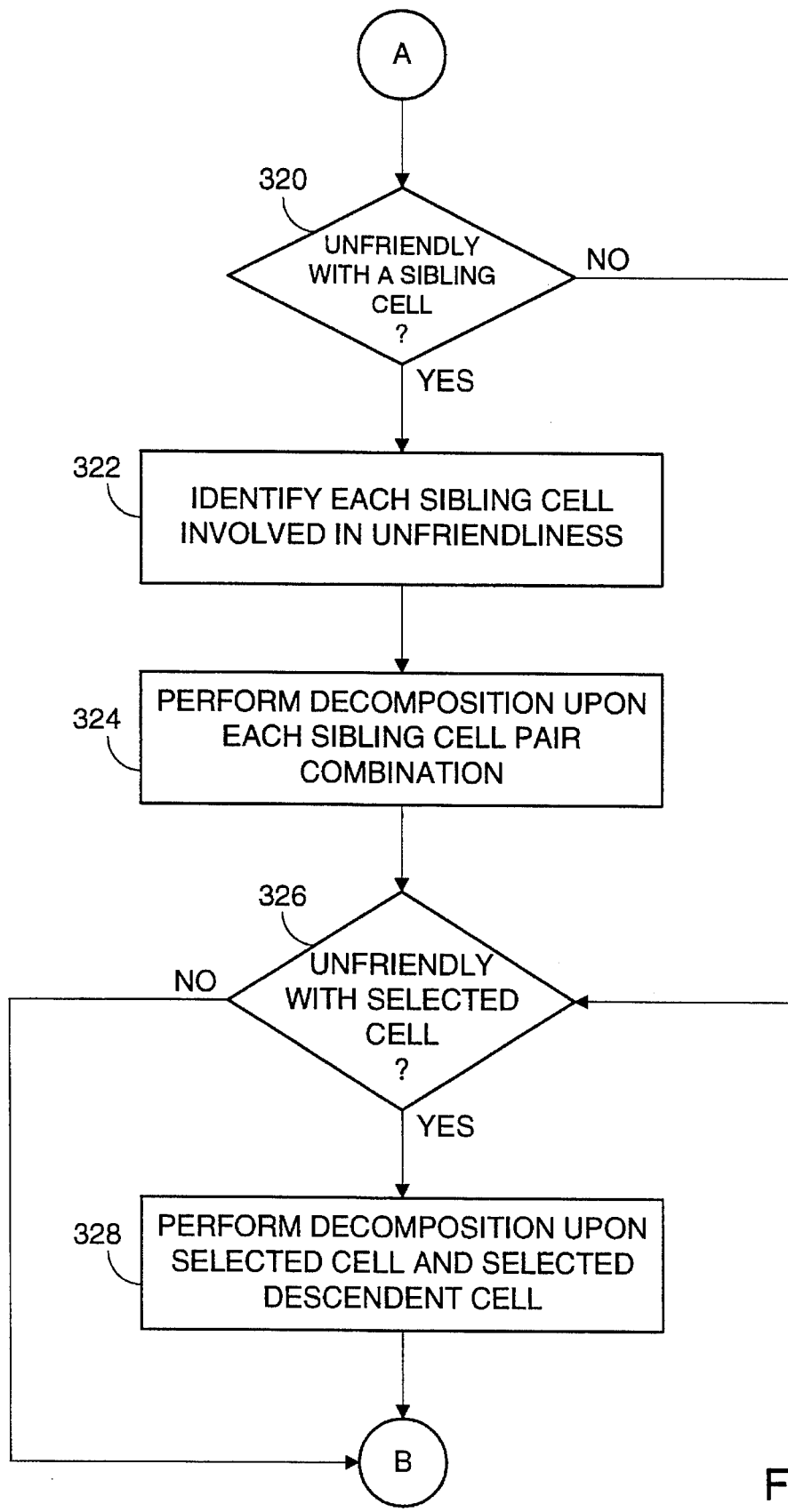

Referring now to FIGS. 5A and 5B, a flowchart of a preferred method for organizing the contents of the friendly worklayer memory 54 and the unfriendly worklayer memory 56 is shown. The preferred method begins in step 300 with the processing unit 12 determining whether the reference to a shape model is present in the selected cell. If the selected cell references a shape model, the processing unit 12 selects a next shape model reference in step 302. After step 302, the processing unit 12 retrieves a friendly function corresponding to the selected verification function from the friendly function memory 52, and applies the friendly function to the shape model in step 304 to determine whether the shape model is friendly towards each other model in the selected cell, as will be described in more detail below. If the shape model is friendly, the processing unit 12 adds the shape model to the friendly worklayer memory 54 in step 306. If the shape model is unfriendly, the processing unit 12 adds the shape model in the unfriendly worklayer memory 56 in step 308. After either of steps 306 or 308, the processing unit 12 determines whether the selected cell contains another shape model reference in step 310. If the selected cell contains another shape model reference, the preferred method returns to step 302.

In the preferred embodiment, the friendly function is applied in a first and a second phase. In the first phase, all other shape models in the selected cell are tested as candidates for placement in the unfriendly worklayer memory 56. As described in co-pending application Ser. No. 08/123,330, each shape model has an associated bounding box that defines a placement border surrounding the shape model. Candidates for placement into the unfriendly worklayer memory 56 are first selected based upon a non-robust test of unfriendliness usually involving the bounding box of each shape model being tested. If the friendly function tests for "overlap" between bounding boxes, shape models are candidates for entry into the unfriendly worklayer memory 56 when the shape models' bounding boxes overlap. If shape models' bounding boxes do not overlap, the shape models are entered into the friendly worklayer memory 54. To be chosen for entry into the unfriendly worklayer memory 56, the shape models themselves, as opposed to just their bounding boxes, must truly overlap. The determination of whether any shape models themselves overlap is made in the second phase of the friendly function's application. The two phases further improve the operating speed of the method.

All shape models constituting the digitized mask layers being analyzed are analyzed for the selected cell. Knowledge of the similarity of environments of the child group models of the selected cell reduces the friendliness testing to that subset of environments which are each different from all others. In the preferred embodiment, the results of the friendliness testing for a single representative environment from a set of similar environments are copied to the appropriate friendly and unfriendly worklayer memories 54, 56.

If it is determined in step 300 that the selected cell does not reference a shape model, or if it is determined in step 310 that each shape model reference has been considered, the processing unit next determines in step 312 whether the selected cell references a descendent cell. If the selected cell references a descendent cell, the processing unit 12 selects a next descendent cell reference in step 314. Next, in step 320 (FIG. 5B), the processing unit 12 determines whether the selected descendent cell is unfriendly with a sibling cell. If the selected descendent cell is unfriendly with a sibling cell, the processing unit 12 identifies each sibling cell involved in the unfriendliness in step 322. Next, the processing unit performs a decomposition upon each sibling cell pair combination in step 324. As will be described in detail below in the description of FIG. 6, in the decomposition the processing unit 12 identifies each shape model at the selected descendent cell's hierarchical level and each lower hierarchical level that contributes to the unfriendliness.

After step 324, or after step 320 if no inter-sibling unfriendliness is present, the processing unit 12 determines in step 326 whether the selected cell and the selected descendent cell are unfriendly. If the selected cell and the selected descendent cell are unfriendly, the processing unit 12 performs a decomposition upon the selected cell and the selected descendent cell in step 328. In a manner analogous to step 324, in the decomposition the processing unit 12 identifies each lower-level shape model that contributes to the unfriendliness between the selected cell and the selected descendent cell. After step 328, or after step 326 if the selected cell and the selected descendent cell are friendly, the preferred method returns to step 312.

Figure 6:
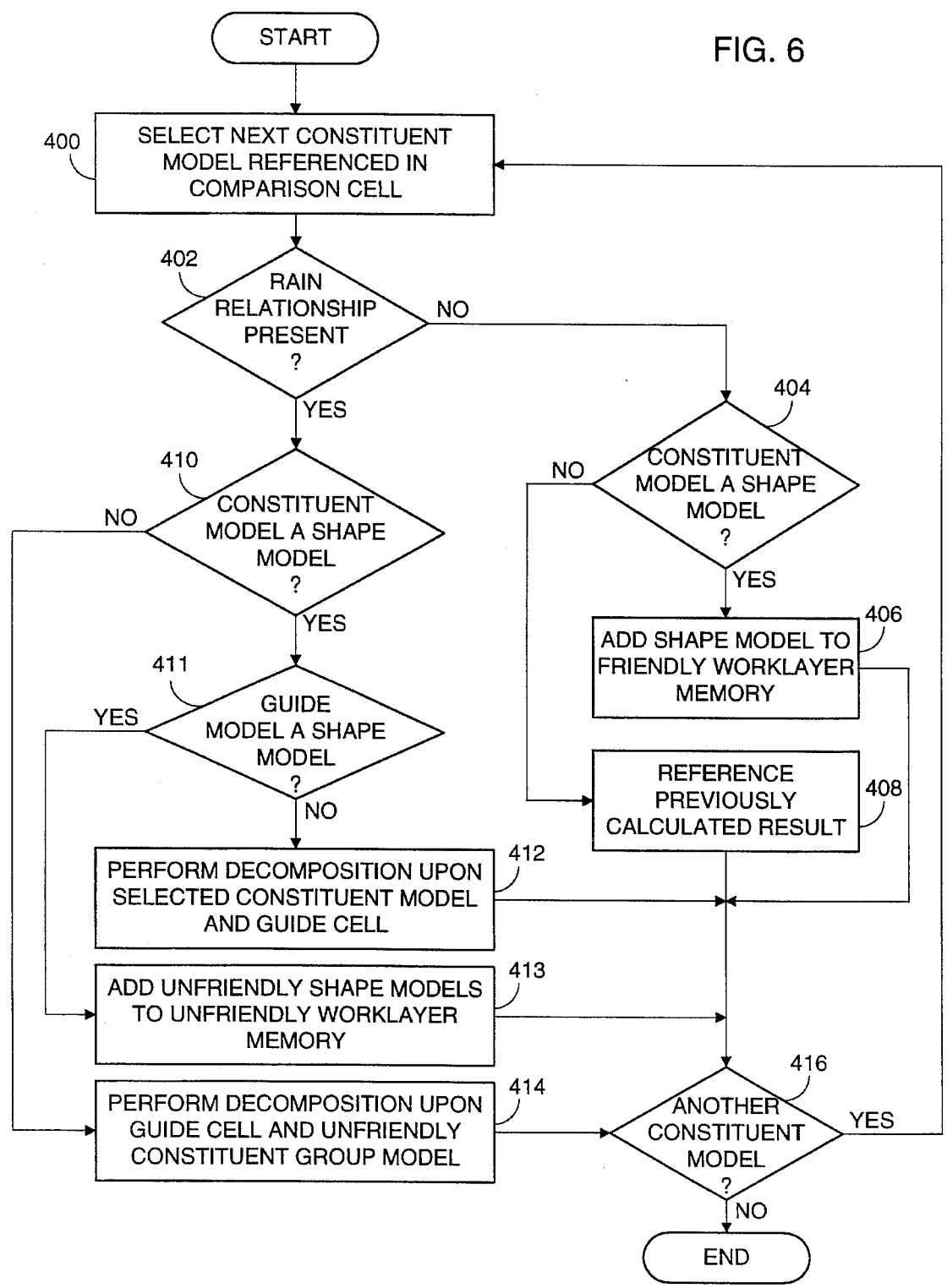
FIG. 6 is a flowchart of a preferred method for performing decomposition in the present invention.

The present invention initiates a decomposition to identify each shape model below a selected cell's hierarchical level that is unfriendly with a shape model referenced by the selected cell. When unfriendliness is present between a descendent cell referenced by the selected cell and one or more sibling cells at the same hierarchical level as the descendent cell, the present invention also initiates a decomposition to identify each shape model below the selected cell's hierarchical level involved in the unfriendliness. Referring now to FIG. 6, a flowchart of a preferred method for performing a decomposition (steps 324 and 328 of FIGS. 5A and 5B) upon a guide model and a comparison cell is shown. As will be described in detail below, in a decomposition upon a guide model and a comparison cell, each model referenced in the comparison cell is examined in view of a rain relationship with the guide model. In the preferred embodiment, the guide model can be a guide shape model or a guide cell (i.e., a guide group model). Initially, a decomposition is performed between a guide cell and a comparison cell. During the decomposition, one or more additional decompositions may be performed in which the guide model can be a guide shape model rather than a guide cell. For ease of understanding, the discussion below begins with a decomposition upon a guide cell and a comparison cell. Those skilled in the art will recognize that the steps described below identically apply to the case of a guide shape model and a comparison cell. Preferably, a decomposition upon cells is initiated via a function call that identifies a first cell and a second cell. In the function call, the ordering of the cells identified determines which cell is selected as the guide cell and which cell is selected as the comparison cell. In step 328 of FIGS. 5A and 5B, the guide cell is the selected cell, and the comparison cell is the selected descendent cell. Similarly, in step 324 of FIGS. 5A and 5B, a first cell in each sibling cell pair is the guide cell, and a second cell in each sibling cell pair is the comparison cell.

The preferred method begins in step 400 with the processing unit 12 selecting a next constituent model referenced by the comparison cell. Next, in step 402, the processing unit 12 examines the contents of the rain relationship register 36 to determine whether a rain relationship is present between a shape model in the guide cell and the selected constituent model. If no rain relationship is present, the processing unit 12 determines whether the selected constituent model is a shape model in step 404. If the selected constituent model is a shape model, the processing unit 12 adds the selected constituent model to the friendly worklayer memory 54 in step 406, thereby identifying the selected constituent model as friendly. If the selected constituent model is a group model, the processing unit 12 stores a reference to the group model's previously calculated verification result in the appointed cell's results list within the results register 38 in step 408.

If the processing unit 12 determines in step 402 that a rain relationship is present, the processing unit 12 determines in step 410 whether the selected constituent model is a shape model. If the selected constituent model is not a shape model but rather is a group model, the processing unit 12 performs a decomposition upon the guide cell and the unfriendly constituent group model in step 414. Those skilled in the art will recognize that via step 414, the preferred method is recursive. In the decomposition initiated via step 414, the previously selected guide cell remains as a guide model, and the previously selected constituent model, being an unfriendly group model, becomes a comparison cell.

If the processing unit 12 determines in step 410 that the selected constituent model is a shape model, the processing unit 12 next determines whether the guide model is a shape model in step 411. If the guide model is not a shape model but rather is a guide cell, the processing unit 12 performs a decomposition upon the selected constituent model and the guide cell in step 412. As with step 414, step 412 is performed recursively in the preferred method. In the decomposition initiated in step 412, the previously selected constituent model becomes a guide model, and the previously selected guide cell becomes a comparison cell. Step 412 is initiated to determine each shape model in the previously-selected guide model that is unfriendly with the previously-selected constituent model.

If the processing unit 12 determines in step 411 that the guide model is a shape model, the processing unit 12 adds the selected constituent model and the guide model to the unfriendly worklayer memory 56 in step 413, thereby identifying the selected constituent model and the guide model as unfriendly. In step 413, the processing unit 12 preferably does not add the guide model to the unfriendly worklayer memory 56 if the guide model is already present in the unfriendly worklayer memory 56. Those skilled in the art will recognize that step 413 limits a chain of recursive operations.

Following step 406, step 408, step 412, step 413, or step 414, the processing unit 12 determines whether the comparison cell contains a reference to another constituent model in step 416. If another constituent model is referenced, the preferred method returns to step 400. Once each constituent model referenced in the comparison cell has been considered, the preferred method ends.

Figure 7A:
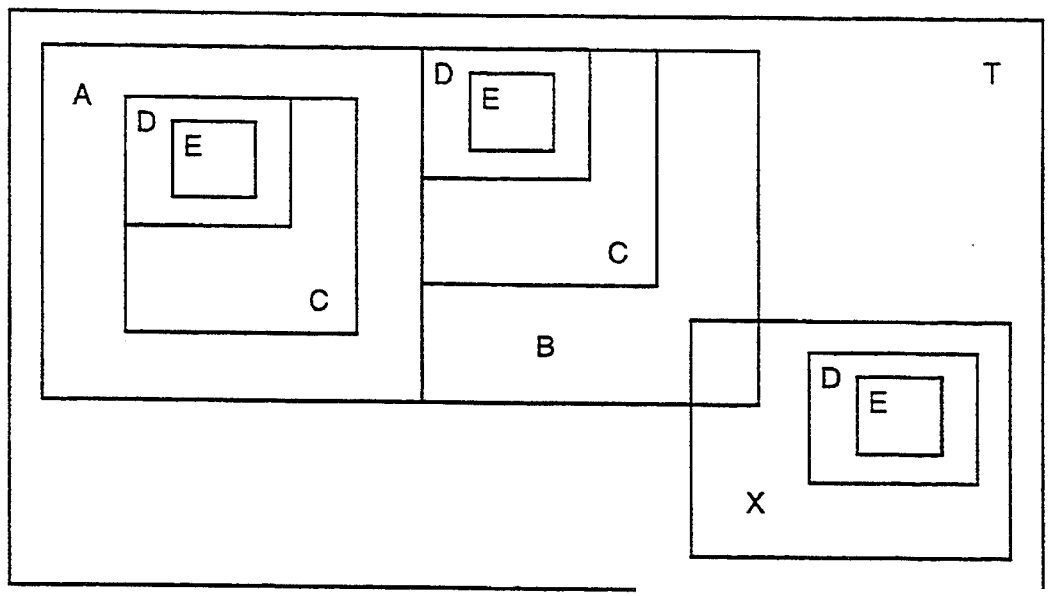
FIG. 7A is a block diagram of a group of cells forming an exemplary integrated circuit design.

Referring now to FIG. 7A, a block diagram of a group of cells forming an exemplary integrated circuit design 80 is shown. The exemplary integrated circuit design 80 contains cells labeled A, B, C, D, E, T, and X having the positional relationships shown. Each cell contains one or more references to constituent models, where a constituent model can be a shape model or a group model.

Figure 7B:
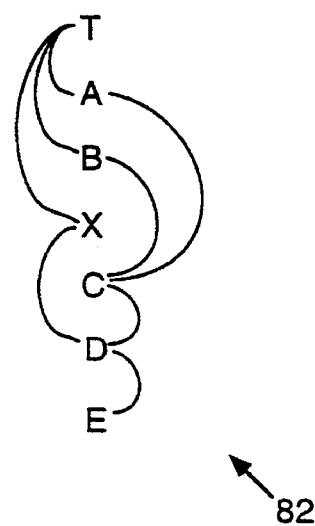
FIG. 7B is a block diagram of a hierarchical cell reference graph corresponding to the integrated circuit design of FIG. 7A.

Referring also now to FIG. 7B, a hierarchical block diagram showing a cell reference graph 82 corresponding to the exemplary integrated circuit design 80 is shown. In the cell reference graph 82, a higher-level cell's reference to a lower-level cell is shown as a curved line connecting the higher-level cell to the lower-level cell. Thus, cell T references cells A, B, and X; cells A and B reference cell C; cells X and C reference cell D; and cell D references cell E. As shown in FIG. 7B, cell E does not reference any lower-level cell and is therefore a leaf cell. Because cell T references cells A, B, and X, cells A, B, and X are the child cells of cell T. In a like manner, cell D is the parent cell of cell E because cell D references cell E.

Figure 8:
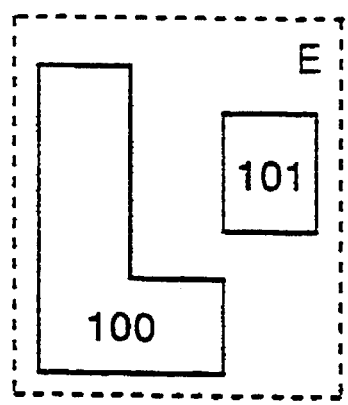
FIG. 8 is a block diagram showing an exemplary collection of constituent models within cell "E" of the cell reference graph of FIG. 7B.
Figure 9:
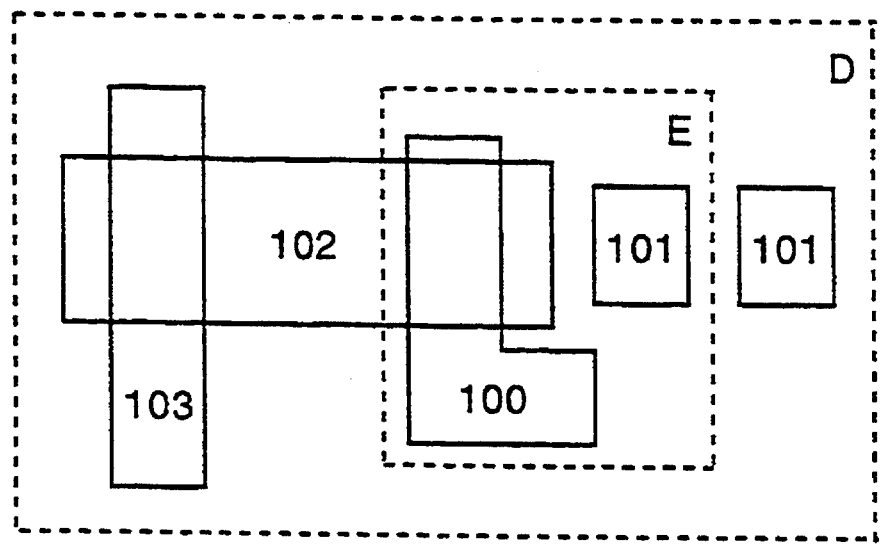
FIG. 9 is a block diagram showing an exemplary collection of constituent models within cell "D" of the cell reference graph of FIG. 7B and their relationship to cell "E."

To facilitate greater understanding of the present invention, model-based verification of cells D and E within the cell reference graph 82 corresponding to the exemplary integrated circuit design 80 is now considered. Referring also now to FIG. 8, a block diagram of an exemplary collection of constituent models within cell E is shown. Cell E is defined herein as containing exemplary shape models identified as 100 and 101, where each shape model is oriented as shown. Referring also now to FIG. 9, a block diagram of an exemplary collection of constituent models within cell D and their relationship to cell E is shown. Cell D contains shape models 101, 102, and 103. Within cell D, shape model 102 is unfriendly with cell E, and maintains a lower-level rain relationship with shape 100 of cell E. In addition, shape models 102 and 103 impinge upon each other, indicating that they are mutually unfriendly.

In the verification of cells D and E, the processing unit 12 first selects cell E for verification because cell E is a leaf cell that has not been previously verified, in accordance with step 200 of FIG. 4. The processing unit 12 subsequently selects a next verification function stored in the verification function memory 50 in accordance with step 202 of FIG. 4. After selecting the verification function, the processing unit 12 next determines that cell E contains a reference to a shape model in accordance with step 300 of FIG. 5A, and then selects shape model 100 in accordance with step 302 of FIG. 5A. In accordance with steps 304 and 306 of FIG. 5A, the processing unit 12 determines that shape model 100 in cell E is friendly, and therefore adds shape model 100 to the friendly worklayer memory 54. After adding shape model 100 to the friendly worklayer memory 54, the processing unit 12 determines that cell E also references shape model 101 in accordance with step 310 of FIG. 5A. The processing unit 12 subsequently determines that shape model 102 is friendly, and adds shape model 102 to the friendly worklayer memory 54 in accordance with steps 304 and 306 of FIG. 5A.

After adding shape model 102 to the friendly worklayer memory 54, the processing unit 12 determines that cell E does not contain a reference to a descendent cell in accordance with step 312 of FIG. 5A. The processing unit 12 then selectively applies the selected verification function to the collective group of shape models stored in the friendly worklayer memory 54 in accordance with step 206 of FIG. 4, and stores each corresponding verification result in the results list of the selected cell within the results register 38. If additional verification functions are to be considered, the processing unit 12 verifies cell E in the manner described above for each remaining verification function. After each verification function has been considered, the processing unit 12 adds a reference to cell E to the completion list in accordance with step 209 of FIG. 4, and the verification of cell E is complete.

In accordance with step 210 of FIG. 4, the processing unit 12 next determines that another cell is to be verified. Because no other leaf cells remain to be verified, the processing unit 12 next selects a cell in which each lower-level group model referenced has been previously verified in accordance with step 200 of FIG. 4. Immediately following the verification of cell E, cell D is the only cell in which each lower-level group model referenced, namely cell E, has been previously verified. Thus, the processing unit 12 selects cell D as the next cell to be verified.

After selecting cell D, the processing unit 12 determines that shape models are referenced in cell D in accordance with step 300 of FIG. 5A. Next, the processing unit 12 selects shape model 101 as referenced by cell D, determines that shape model 101 is friendly, and adds shape model 101 to the friendly worklayer memory 54 in accordance with steps 302, 304, and 306 of FIG. 5A. The processing unit 12 then determines that cell D references another shape model in accordance with step 310 of FIG. 5A. The processing unit 12 subsequently selects shape model 102, determines that shape model 102 is unfriendly with shape model 103, and adds shape model 102 to the unfriendly worklayer memory 56 in accordance with steps 302, 304, and 308 of FIG. 5A. In a like manner, the processing unit 12 subsequently adds shape model 103 to the unfriendly worklayer memory 56.

After adding shape model 103 to the unfriendly worklayer memory 56, the processing unit 12 determines that cell D references a descendent cell, namely cell E, in accordance with step 312 of FIG. 5A. The processing unit 12 then selects cell E in accordance with step 314 of FIG. 5A, and, in accordance with step 320 of FIG. 5B, determines that cell E is not unfriendly with a sibling cell. Next, the processing unit 12 determines that cell E is unfriendly with a shape model in cell D in accordance with step 326 of FIG. 5B, and therefore performs a decomposition upon cell D and cell E in accordance with step 328 of FIG. 5B.

In the decomposition performed upon cell D and cell E, cell D is the guide cell, and cell E is the comparison cell. The processing unit 12 selects a next constituent model, namely shape model 100, in cell E in accordance with step 400 of FIG. 6. In accordance with steps 402 and 410 of FIG. 6, the processing unit 12 determines that the selected constituent model in cell E maintains a rain relationship with a shape model in cell D, and determines that the selected constituent model is a shape model. The processing unit 12 next determines that the current guide model, namely cell D, is not a shape model in accordance with step 411 of FIG. 6, and thus performs a decomposition upon shape model 100 in cell E and cell D in accordance with step 412 of FIG. 6.

In the decomposition upon shape model 100 and cell D, shape model 100 is specified as the guide model, and cell D is specified as the comparison cell. The decomposition upon shape model 100 and cell D begins with the processing unit 12 selecting the shape model 101 as referenced in cell D, determining that no rain relationship is present between shape model 100 as referenced in cell E and shape model 101 as referenced in cell D, and adding shape model 101 as referenced in cell D to the friendly worklayer memory 54 in accordance with steps 400, 402, 404, and 406 of FIG. 6.

The processing unit 12 subsequently selects shape model 102 as referenced in cell D as the next constituent model in the comparison cell, and determines that a rain relationship exists between shape model 100 referenced in cell E and shape model 102 referenced in cell D in accordance with steps 400 and 402 of FIG. 6. Next, the processing unit 12 determines that the selected constituent model is a shape model in accordance with step 410 of FIG. 6. The processing unit 12 then determines that the guide model, namely shape model 100 as referenced in cell E, is a shape model, and adds shape model 100 as referenced in cell E and shape model 102 as referenced in cell D to the unfriendly worklayer memory in accordance with steps 411 and 413 of FIG. 6.

After adding shape model 100 as referenced in cell E and shape model 102 as referenced in cell D to the unfriendly worklayer memory 56, the processing unit 12 selects shape model 103 as referenced in cell D as the next constituent model in accordance with step 400 of FIG. 6. The processing unit 12 then determines that no rain relationship exists between shape model 100 as referenced in cell E and shape model 103 as referenced in cell D, and adds shape model 103 as referenced in cell D to the friendly worklayer memory 54 in accordance with steps 402, 404, and 406 of FIG. 6. After adding shape model 103 as referenced in cell D to the friendly worklayer memory 54, the decomposition upon shape model 100 as referenced in cell E and cell D is complete.

The processing unit 12 next continues the decomposition upon cell D and cell E that was previously interrupted for the decomposition upon shape model 100 and cell D. In the continuation of the decomposition upon cell D and cell E, the processing unit 12 selects cell selects shape model 101 as referenced in cell E, and determines that no rain relationship is present between a shape model in cell D and shape model 100 as referenced in cell E in accordance with steps 400 and 402 of FIG. 6. The processing unit 12 subsequently adds shape model 100 as referenced in cell E to the friendly worklayer memory 54 in accordance with step 406 of FIG. 6, after which the decomposition upon cell D and cell E is complete.

Cell D does not reference another descendent cell. In accordance with step 206 of FIG. 4, the processing unit 12 therefore applies the selected verification function to the collective group of shape models stored in the unfriendly worklayer memory 56. The processing unit 12 also selectively applies the selected verification function to the collective group of shape models stored in the friendly worklayer memory 54. If additional verification functions are to be considered, the processing unit 12 verifies cell D in the manner described above for each remaining verification function. After each verification function has been considered, the processing unit 12 adds cell D to the completion list in accordance with step 209 of FIG. 4.

The present invention hierarchically verifies a cell reference graph beginning with each leaf cell and sequentially proceeding to each cell whose lower-level group models have all been previously verified. During the verifications performed at each hierarchical level, the processing unit 12 accounts for intra-cell unfriendliness, lower-level rain relationships, and inter-sibling rain relationships between models. As a result, the present invention generates correct verification results regardless of the interactions that are present between models. The present invention places no restrictions upon allowable interactions or hierarchical relationships between cells as is done in the prior art. This in turn allows successful verification of highly complex integrated circuit layouts.

While the present invention has been described with reference to certain preferred embodiments, those skilled in the art will recognize that various modifications may be provided. For example, rather than considering each verification function for a selected cell, each cell could be considered in view of a first verification function, after which each cell could be considered in view of a second verification function, and so on. As another example, rain relationships could be determined "on the fly," that is, the existence of each rain relationship could be determined through a set of calculations rather than through an examination of the contents of the rain relationship register 36. These and other variations upon and modifications to the preferred embodiments are provided for by the present invention, which is limited only by the following claims.

What is claimed is:

1. A system for model-based verification of local design rules in a physical integrated circuit design, the system comprising:

a processing unit having an input and an output, for performing the model-based local design rule verification of the physical integrated circuit design according to a sequence of program instruction steps;

a verification database having an input and an output, for storing a cell reference graph representing the physical integrated circuit design as a set of cells, each cell representing one of a constituent model and a shape model on a physical mask design, each constituent model comprising a reference to one of a shape model and a reference to a second cell at a lower hierarchical level, the output of the verification database coupled to the input of the processing unit, the input of the verification database coupled to the output of the processing unit, said verification database further comprising:

a reference graph register having an input and an output, for storing the cell reference graph representation of the physical integrated circuit design, the output of the reference graph register coupled to the input of the processing unit, the input of the reference graph register coupled to the output of the processing unit;

a results register having an input and an output, for storing a verification result, the input of the results register coupled to the output of the processing unit, and the output of the results register coupled to the input of the processing unit; said processing unit overriding one of said verification results and said results register storing a new verification result associated with a first cell of said set of cells if a position of one of a second cell of said set of cells and a shape model violates said verification function; and a verification memory having an input and an output, for storing said verification function and one or more models during model-based local design rule verification, the output of the verification memory coupled to the input of the processing unit.

2. The system of claim 1, wherein the verification memory comprises:

a verification function memory having an input and an output, for storing a verification function, the output of the verification function memory coupled to the input of the processing unit, and the input of the verification function memory coupled to the output of the processing unit; and an unfriendly worklayer memory having an input and an output, for storing two or more unfriendly shape models, the input of the unfriendly worklayer memory coupled to the output of the processing unit, and the output of the unfriendly worklayer memory coupled to the input of the processing unit.

3. The system of claim 2, further comprising a friendly function memory having an input and an output, for storing a friendly function used to determine whether a set of shape models is friendly, the output of the friendly function memory coupled to the input of the processing unit, the input of the friendly function memory coupled to the output of the processing unit.

4. The system of claim 2, further comprising a friendly worklayer memory having an input and an output, for storing a friendly shape model, the output of the friendly worklayer memory coupled to the input of the processing unit, and the input of the friendly worklayer memory coupled to the output of the processing unit.

5. The system of claim 1, further comprising a rain relationship register having an input and an output, for storing a reference to a rain relationship between cells in the cell reference graph, the output of the rain relationship register coupled to the input of the processing unit, and the input of the rain relationship register coupled to the output of the processing unit.

6. In a system having a processing unit, a verification memory storing a verification function, and a verification database storing a cell reference graph representing a physical integrated circuit design as a hierarchical collection of cells, each cell in the cell reference graph associated with a hierarchical level and comprising one of a reference to a constituent model and a reference to a shape model, each constituent model comprising one from the group of a reference to a shape model and a reference to another cell at a lower hierarchical level, a method for model-based verification of local design rules in the physical integrated circuit design comprising the steps of:

selecting a cell for verification;

selecting a verification function;

identifying each shape model referenced by the selected cell that is unfriendly with another shape model referenced by the selected cell;

determining whether the selected cell references a first cell at a lower hierarchical level that is unfriendly with one of said selected cell shape models and a second cell at one of the same hierarchical level or a lower hierarchical level as said first cell;

performing a decomposition upon the first cell and the second cell if the selected cell references a first cell at a lower hierarchical level that is unfriendly with a second cell at one of the same hierarchical level and said lower hierarchical level as the first cell;

applying said selected verification function to the identified unfriendly shape models to determine a verification result representative of whether a design rule associated with said selected verification function is violated; and storing said verification result in a memory location associated with said selected cell and overriding any previous verification result associated with one of said first cell and said second cell, in said verification memory.

7. The method of claim 6, further comprising the steps of identifying each shape model referenced by the selected cell that is friendly with each other shape model referenced by the selected cell.

8. The method of claim 7, further comprising the step of selectively applying the selected verification function to the identified friendly shape models.

9. The method of claim 7, wherein the decomposition comprises the steps of:

selecting a constituent model referenced by the second cell;

determining whether a shape model referenced in the first cell maintains a rain relationship with the constituent model; and determining whether the constituent model is a shape model.

10. The method of claim 9, wherein in the event that the shape model referenced in the first cell does not maintain a rain relationship with the constituent model and the constituent model is a shape model, the method further comprises the step of identifying the constituent model as friendly with the shape model referenced in the first cell.

11. The method of claim 9, wherein in the event that the shape model referenced in the first cell does not maintain a rain relationship with the constituent model and the constituent model is not a shape model, the method further comprises the step of referencing a previously calculated verification result associated with the constituent model.

12. The method of claim 9, wherein in the event that the shape model referenced in the first cell maintains a rain relationship with the constituent model and the constituent model is not a shape model, the method further comprises the step of performing a decomposition upon the first cell and the constituent model.

13. The method of claim 9, wherein in the event that the shape model referenced in the first cell maintains a rain relationship with the constituent model and the constituent model is a shape model, the method further comprises the step of performing a decomposition upon the constituent model and the first cell.

14. The method of claim 13, wherein the step of performing the decomposition upon the constituent model and the first cell comprises the step of identifying each shape model in the first cell that is unfriendly with the constituent model.

15. The method of claim 6, further comprising the steps of:

determining whether the selected cell references a lower-level cell that is unfriendly with a shape model referenced in the selected cell; and in the event that the selected cell references a lower-level cell that is unfriendly with a shape model referenced in the selected cell, performing a decomposition upon the selected cell and the lower-level cell.

16. The method of claim 15, wherein the decomposition comprises the steps of:

selecting a constituent model referenced by the lower-level cell;

determining whether the shape model in the selected cell maintains a rain relationship with the constituent model; and determining whether the constituent model is a shape model.

17. The method of claim 16, wherein in the event that shape model in the selected cell does not maintain a rain relationship with the constituent model and the constituent model is a shape model, the method further comprises the step of identifying the constituent model as friendly with the shape model in the selected cell.

18. The method of claim 16, wherein in the event that the shape model in the selected cell does not maintain a rain relationship with the constituent model and the constituent model is not a shape model, the method further comprises the step of referencing a previously calculated verification result associated with the constituent model.

19. The method of claim 16, wherein in the event that the shape model in the selected cell maintains a rain relationship with the constituent model and the constituent model is not a shape model, the method further comprises the step of performing a decomposition upon the shape model in the selected cell and the constituent model.

20. The method of claim 16, wherein in the event that the shape model in the selected cell maintains a rain relationship with the constituent model and the constituent model is a shape model, the method further comprises the step of performing a decomposition upon the constituent model and the selected cell.

21. The method of claim 20, wherein the step of performing the decomposition upon the constituent model and the selected cell comprises the step of identifying each model in the selected cell that is unfriendly with the constituent model.

22. The system of claim 1, wherein said first cell is one of a sibling cell and a child cell of said second cell.

23. The system of claim 1, wherein each of said cells comprises one of a reference to another of said cells and a reference to one of a plurality of shape models.

* * * * *